(12) United States Patent
Barry et al.

(10) Patent No.: US 7,603,205 B2
(45) Date of Patent: Oct. 13, 2009

(54) APPARATUS AND METHOD FOR THERMAL STABILIZATION OF PCB-MOUNTED ELECTRONIC COMPONENTS WITHIN AN ENCLOSED HOUSING

(75) Inventors: Charles F. Barry, Santa Clara, CA (US); Reed A. Parker, Saratoga, CA (US); Tian Shen, Cupertino, CA (US); Feng F. Pan, San Jose, CA (US); Meenakshi Subramanian, Santa Clara, CA (US)

(73) Assignee: Brilliant Telecommmunications, Inc., Campbell, CA (US)

( * ) Notice: Subject to any disclaimer, the term of this patent is extended or adjusted under 35 U.S.C. 154(b) by 0 days.

(21) Appl. No.: 11/843,521

(22) Filed: Aug. 22, 2007

(65) Prior Publication Data
US 2008/0137309 A1    Jun. 12, 2008

Related U.S. Application Data

(60) Provisional application No. 60/839,515, filed on Aug. 22, 2006.

(51) Int. Cl.
| G05D 23/00 | (2006.01) |
| G05B 13/02 | (2006.01) |
| H05B 3/02  | (2006.01) |
| H05B 1/02  | (2006.01) |
| G01K 1/08  | (2006.01) |
| G01K 17/00 | (2006.01) |

(52) U.S. Cl. .................. 700/299; 700/53; 219/486; 219/494; 702/132; 702/136

(58) Field of Classification Search .................. 700/53, 700/299, 300; 219/486, 494; 236/78 B, 236/78 D; 165/205; 702/132, 136
See application file for complete search history.

(56) References Cited

U.S. PATENT DOCUMENTS

| 4,317,985 A | 3/1982 | Wilson |
| 5,180,942 A | 1/1993 | Marvin et al. |
| 5,456,870 A | 10/1995 | Bulgrin |

(Continued)

OTHER PUBLICATIONS

"Introduction to Quartz Frequency Standards—Aging," Oscilent Corporation—Technical References, http://www.oscilent.com/esupport/TechSupport/ReviewPapers/IntroQuartz/vigaging.htm, Nov. 9, 2007.

(Continued)

*Primary Examiner*—Sean P Shechtman
(74) *Attorney, Agent, or Firm*—Cooley Godward Kronish LLP

(57) ABSTRACT

An apparatus comprises a matrix of thermoelectric devices for applying thermal gradients across an electronic component mounted in a PCB substrate within an enclosed housing. A matrix of thermosensitive devices are placed around the perimeter of the electronic component to measure thermal gradients associated with the component. A controller controls the matrix of thermoelectric devices based on the thermal gradients measured by the matrix of thermosensitive devices with a matrix of thermocouple coefficients.

24 Claims, 5 Drawing Sheets

U.S. PATENT DOCUMENTS

| | | |
|---|---|---|
| 5,659,270 A | 8/1997 | Millen et al. |
| 5,703,542 A | 12/1997 | Blandino |
| 5,729,181 A | 3/1998 | Cutler et al. |
| 5,777,524 A | 7/1998 | Wojewoda et al. |
| 5,917,272 A | 6/1999 | Clark et al. |
| 6,127,661 A | 10/2000 | Fry |
| 6,166,608 A | 12/2000 | Merriss et al. |
| 6,208,213 B1 | 3/2001 | Anastasyev et al. |
| 6,362,700 B1 | 3/2002 | Fry |
| 6,501,340 B1 | 12/2002 | Flood |
| 6,630,872 B1 | 10/2003 | Lanoue et al. |
| 6,647,428 B1 | 11/2003 | Bannai et al. |
| 6,742,634 B2 * | 6/2004 | Watanabe et al. ........... 188/171 |
| 6,880,970 B2 | 4/2005 | Mirov |
| 7,020,540 B2 | 3/2006 | Linehan et al. |
| 7,251,256 B1 | 7/2007 | Barry et al. |
| 2003/0121905 A1 | 7/2003 | Nanno et al. |
| 2005/0285482 A1 | 12/2005 | Oita et al. |
| 2006/0012446 A1 | 1/2006 | Hardy et al. |
| 2006/0081605 A1 | 4/2006 | Oita et al. |
| 2007/0251939 A1 * | 11/2007 | Minkovich et al. .......... 219/505 |

OTHER PUBLICATIONS

International Search Report and Written Opinion for International Application No. PCT/US2007/076488, mailed on Jul. 16, 2008, 7 pages.

* cited by examiner

US 7,603,205 B2

APPARATUS AND METHOD FOR THERMAL STABILIZATION OF PCB-MOUNTED ELECTRONIC COMPONENTS WITHIN AN ENCLOSED HOUSING

CROSS-REFERENCE TO RELATED APPLICATIONS

This application claims priority to U.S. Provisional Application Ser. No. 60/839,515, filed Aug. 22, 2006, which is incorporated herein by reference in its entirety.

BRIEF DESCRIPTION OF THE INVENTION

This invention relates generally to stabilizing the temperature of electronic components. More particularly, this invention is directed towards using a control processor for stabilizing thermal gradients across an electronic component that is PCB-mounted within an enclosed housing.

BACKGROUND OF THE INVENTION

Electronic components mounted on Printed Circuit Boards ("PCBs") are pervasive throughout a wide range of consumer and industrial products. With recent advances in semiconductor technologies, these electronic components have become smaller, faster, and more powerful. They have also become more densely packed in the PCBs, which may include many layers of intricate electrical circuits and connections supporting the components. This miniaturization has led to several new challenges in electronic component and PCB design, including the ability to control the heat generated by the electronic components during their operation.

A considerable amount of heat may be generated by electronic components during their operation, including transistors, integrated circuits, power controls, switches, oscillators, microprocessors, and the like. The heat generated may cause component failure or malfunction if not properly controlled. Certain types of electronic components may be particularly susceptible to heat dissipation or other temperature effects. In some cases, the temperature must be stabilized for the components to remain within their operating range.

For example, voltage-controlled crystal oscillators ("VCXOs") or oven-controlled crystal oscillators ("OCXOs"), are highly sensitive to temperature gradients, both in time and across their physical dimensions. These temperature gradients may result in undesirable output fluctuations such as thermally induced frequency drift. These output fluctuations may in turn impact the quality of real-time applications and services in computer networks where these oscillators are heavily used, including Pseudo-Wire Emulation ("PWE"), Voice over IP ("VoIP"), video conferencing, and streaming services.

Conventional approaches to control or stabilize the temperature in a PCB include the use of heat sinks and temperature compensation circuits mounted on or external to the PCB, as well as thermally-insulated enclosures to house the PCB. For example, heat sinks are typically mounted on the active surface of a semiconductor die to absorb heat from the die and dissipate the heat by convection into the cooler air, thereby maintaining the temperature across the PCB.

Additional temperature control may be provided by temperature compensation circuits which generally stabilize the performance of a given electronic component or PCB across a wide range of temperatures. In the case of VCXOs and OCXOs, temperature compensation circuits may provide a relatively flat frequency output over a wide range or temperatures.

The PCB and temperature compensation circuits may be enclosed within a thermally-insulated enclosure or housing to protect the PCB and electronic components therein from outside environment hazards, such as ambient heat, moisture, dust, debris, and so on. Thermally-insulated housings may also be used to prevent electromagnetic signals generated by the electronic components from causing Electromagnetic Interference ("EMI") or Radio Frequency Interference ("RFI") to other devices in their vicinity and vice-versa.

The thermally-insulated housings may also include temperature sensors to monitor the temperature around electronic components within the housings. In cases where temperature stability is desired for optimal performance, one or more heating elements may be used together with the sensors to maintain a given temperature gradient across a component. Based on the temperature measured by the sensors, the heating elements may generate more or less heat to achieve the desired temperature gradient.

For example, a single planar heating element has been used to thermally stabilize electronic components mounted on a PCB within a thermally-insulated housing. Though a single planar heating element may stabilize time-based thermal fluctuations for a given electronic component, it may not compensate for thermal gradients across the physical dimensions of the component. These thermal gradients are dependent on the relative positions of other heat-generating electronic components on the PCB, such as power supplies.

A set of linear heating elements that are closely spaced and in parallel may also be used. Although a set of linear heating elements may provide some capability to vary the heating across the physical dimensions of the component, the set may be insufficient to eliminate output fluctuations that degrade real-time applications and services, such as in the case of VCXOs and OCXOs that must maintain a flat frequency output over a wide range of temperatures.

Accordingly, it would be desirable to provide a thermal-management approach that can effectively stabilize temperature gradients across an electronic component mounted on a PCB across both time and the physical dimensions of the component.

SUMMARY OF THE INVENTION

An apparatus, controller and method are described to stabilize the temperature across an electronic component. One embodiment of the invention includes an apparatus having a matrix of thermoelectric devices to set thermal gradients across the electronic component, a matrix of thermosensitive devices to measure thermal gradients associated with the electronic component and a controller for controlling the matrix of thermoelectric devices based on the thermal gradients measured by the matrix of thermosensitive devices with a matrix of thermocouple coefficients.

Another embodiment of the invention includes a controller with executable instructions to detect thermal gradients measured by a matrix of thermosensitive devices associated with an electronic component and to control a set of current values applied to a matrix of thermoelectric devices based on the detected thermal gradients and with a matrix of thermocouple coefficients.

A further embodiment of the invention includes a method for stabilizing the temperature of an electronic component mounted in a printed circuit board substrate within an enclosed housing. The electronic component is heated with a matrix of thermoelectric devices arranged in a first surface of the substrate opposite to a second surface of the substrate mounting the electronic component. Thermal gradients surrounding the electronic component are measured with a matrix of thermosensitive devices mounted on the second surface of the substrate. The heat applied by the matrix of thermoelectric devices is controlled on the thermal gradients measured by the matrix of thermosensitive devices.

BRIEF DESCRIPTION OF THE DRAWINGS

The invention is more fully appreciated in connection with the following detailed description taken in conjunction with the accompanying drawings, in which like reference characters refer to like parts throughout, and in which.

DETAILED DESCRIPTION OF THE INVENTION

An apparatus, controller, and method for stabilizing the temperature across an electronic component are provided. As generally used herein, an electronic component may be any electronic element packaged in a discrete form with two or more connecting leads or pads. Electronic components may be packaged singly, such as resistors, capacitors, and transistors, or in groups, such as in amplifiers, oscillators, and integrated circuits, among others. The electronic components may be typically mounted on Printed Circuit Boards ("PCBs"), which are used to mechanically support or electrically connect electronic components using conductive pathways or traces etched onto a non-conductive substrate. In accordance with the invention, the electronic components may be through-hole or surface mounted. Also in accordance with the invention, a PCB may be placed inside an enclosed volume or housing.

Figure 1:
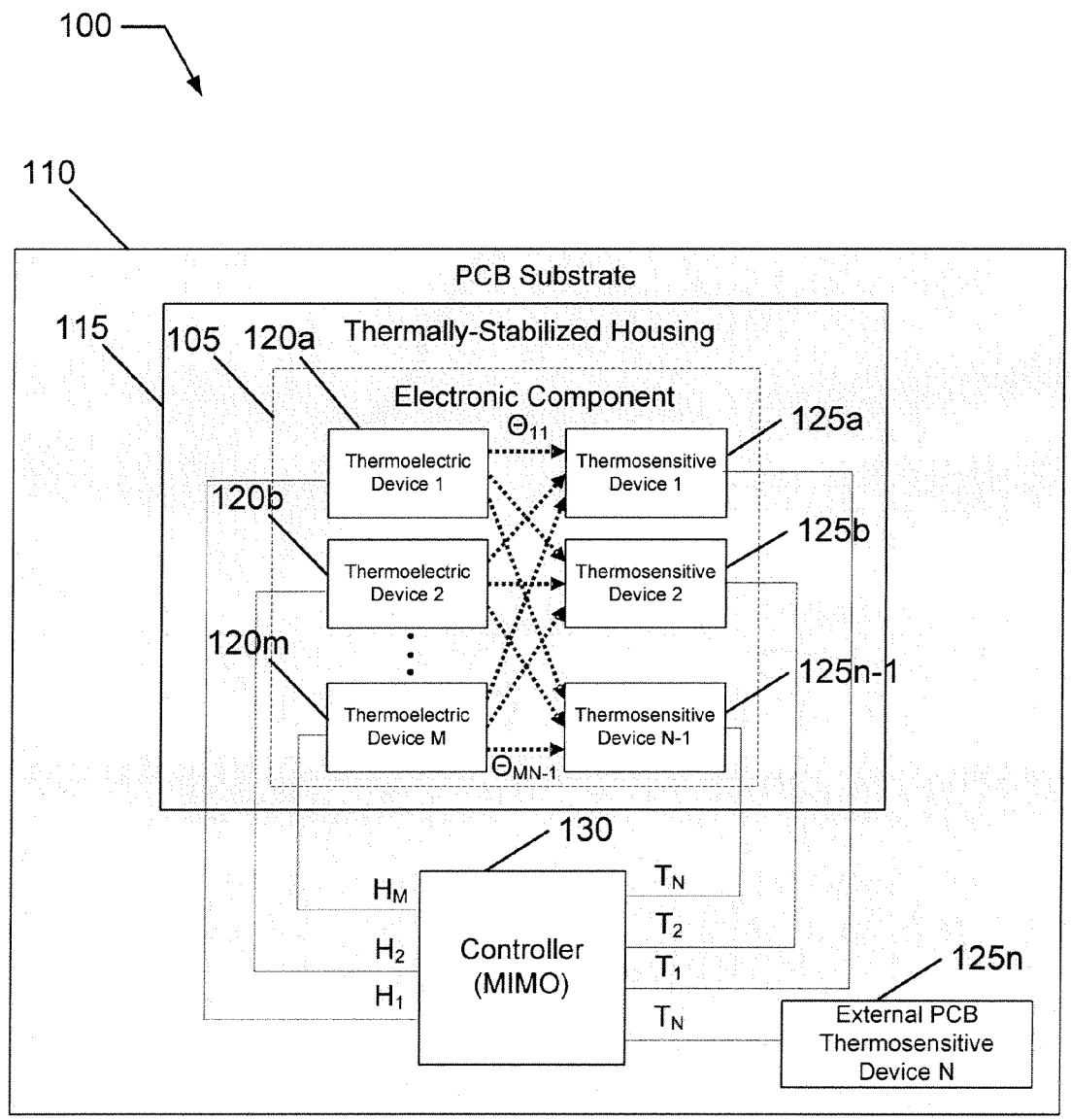
FIG. 1 illustrates a schematic diagram of an apparatus for thermal stabilization of an electronic component constructed according to an embodiment of the invention.

A schematic diagram of an apparatus for thermal stabilization of an electronic component constructed according to an embodiment of the invention is illustrated in FIG. 1. Apparatus 100 is designed to stabilize the temperature around and across electronic component 105 mounted on multi-layer PCB substrate 110. Electronic component 105 is enclosed in thermally-stabilized housing 115, described in more detail herein below. It is appreciated that electronic component 105 may be through-hole or surface mounted on the surface of PCB substrate 110.

Temperature stabilization is achieved with a matrix of thermoelectric devices including a plurality of thermoelectric devices 120a-m, a matrix of thermosensitive devices including a plurality of thermosensitive devices 125a-n, and a controller 130. As generally used herein, a matrix of devices refers to a plurality of devices arranged in a two-dimensional pattern or grid. The matrix of devices may also include devices that are outside the two-dimensional grid, such as, for example, thermosensitive device 125n.

The matrix of thermoelectric devices 120a-m may be arranged in a two-dimensional grid on a surface of PCB substrate 110 opposite the electronic component 105, such as, for example, on the surface under the electronic component 105. The matrix of thermosensitive devices 125a-n may be arranged in a two-dimensional grid on a surface of PCB substrate 110 surrounding the perimeter of and on the same side as the electronic component 105. Some or all of thermosensitive devices 125a-n may also be in direct contact with electronic component 105, such as, for example, mounted on a surface of electronic component 105. In addition, one or more thermosensitive devices may be external to the thermally-stabilized housing 115 to measure thermal gradients associated with the PCB substrate 110 and the external ambient, such as thermosensitive device 125n.

Controller 130 is used to control the plurality of thermoelectric devices 120a-m. Controller 130 generates a set of current values for the plurality of thermoelectric devices 120a-m. The plurality of thermoelectric devices 120a-m convert the set of current values into thermal gradients that are applied across the electronic component 105. It is appreciated that controller 130 may be within or external to the thermally-stabilized housing 115.

The thermal gradients can be used to heat or cool the electronic component 105. In one exemplary embodiment, the plurality of thermoelectric devices 120a-m may be a plurality of heating devices to heat the electronic component 105. For example, a plurality of heating devices may be used to heat a crystal oscillator and maintain a constant temperature across the oscillator and within the thermally-stabilized housing 115. In another exemplary embodiment, the plurality of thermoelectric devices 120a-m may be a plurality of cooling devices for cooling down electronic component 105 and preventing heat dissipation around the component 105.

In another exemplary embodiment, the plurality of thermoelectric devices 120a-m may be hybrid heating and cooling devices, such as, for example, Peltier thermoelectric devices. It is appreciated that any combination of heating and cooling devices may be used in the matrix of thermoelectric devices 120a-m.

The set of current values applied to the plurality of thermoelectric devices 120a-m are generated by the controller 130 based on thermal gradients measured by the plurality of thermosensitive devices 125a-n. The thermosensitive devices 125a-n may be arranged in a two-dimensional grid to detect the thermal gradients on the component side of the PCB substrate 110. The controller 130 receives the thermal gradients from the thermosensitive devices 125a-n and generates a set of current values for the thermoelectric devices 120a-m to convert into a set of thermal gradients applied across the electronic component 105. The set of current values are generated to maintain a desired temperature set-point across the electronic component 105 and within the thermally-stabilized housing 115.

In one exemplary embodiment, controller 130 is a Multiple-Input, Multiple-Output ("MIMO") controller. The MIMO controller maintains a matrix of thermocouple coefficients $\ominus_{ij}$, which are measured in ° C. mm$^2$/Watt. Each thermocouple coefficient $\ominus_{ij}$ is expressed as $\ominus_{ij}=T_j/V_i$, where $T_j$ represents a thermal gradient detected by thermosensitive device j and $V_i$ represents a voltage per area applied to thermoelectric device i. With M thermoelectric devices and N thermosensitive devices, the matrix of thermocouple coefficients is a M×N matrix.

In one exemplary embodiment, a symmetric placement of thermoelectric devices 120a-m in relation to thermosensitive devices 125a-n yields a symmetric MIMO feedback matrix composed of the $\ominus_{ij}$ coefficients. This reduces the complexity of the MIMO controller 130. Further, an equal number, N, of thermosensitive devices and thermoelectric devices ensures a square N×N feedback matrix and reduces the complexity of the MIMO controller 130.

It is appreciated that one or more of the thermosensitive devices 125a-n may be a thermosensitive device external to the thermally-stabilized housing 115 to measure thermal gradients associated with the PCB substrate 110 and the external ambient, such as thermosensitive device 125n. Accordingly the matrix of thermocouple coefficients may include parasitic impedance coefficients associated with the one or more external thermosensitive devices, such as external thermosensitive device 125n.

The thermocouple coefficients in the matrix are generated to maintain a desired temperature set-point across the electronic component 105 and within the thermally-stabilized housing 115. In one exemplary embodiment, the desired temperature set-point may be initially set at an ambient temperature value of 65° F. The thermocouple coefficients may be, in turn, initially set to achieve the initial temperature set-point across the electronic component 105. Accordingly, the thermocouple coefficients are in general kept constant to achieve the desired temperature set-point.

The desired temperature set-point may be adjusted over time as the plurality of thermosensitive devices 125a-n detects different thermal gradients around the electronic component 105. The desired temperature set-point may be adjusted, for example, based on the average thermal gradients detected by the plurality of thermosensitive devices 125a-n measured over a 24-hour period. The thermocouple coefficients may be adjusted accordingly.

In one exemplary embodiment, the desired temperature set-point may be set at a value above the average thermal gradients detected in the past 24-hour period, such as, for example, at 25° F. degrees above the average. This provides a sufficient margin to ensure a stabilized temperature within the housing in cases where the temperature suddenly fluctuates between extremes in any given time period. This also ensures that the desired set-point will remain above the average thermal gradients at any given time.

It is appreciated that the desired temperature set-point may be adjusted differently, such as, for example, by setting it to be at or below the average thermal gradients detected in the past 24-hour period. Further, it is also appreciated that the desired temperature set-point may be maintained constant unless the temperature associated with the PCB substrate 110 and the ambient temperature exceed some pre-determined temperature bounds.

In addition, it is appreciated that the number of devices shown in FIG. 1 is shown for illustration purposes only. For example, multiple electronic components could be mounted on PCB substrate 110. In this case, each electronic component could have a set of thermoelectric devices and a set of thermosensitive devices associated with it. A single or multiple controllers could be used to control the temperature across the electronic components.

Figure 2:
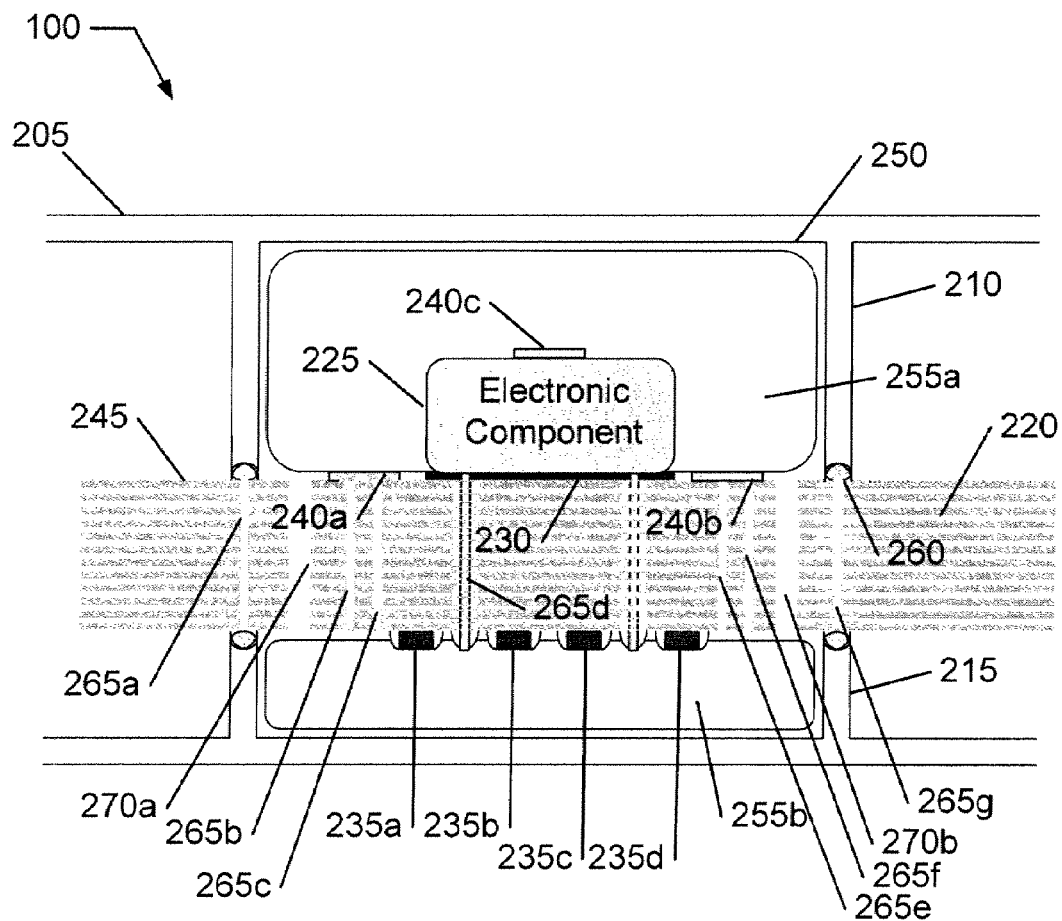
FIG. 2 illustrates a side view of an apparatus for thermal stabilization of an electronic component constructed according to an embodiment of the invention.

A side view of an apparatus for thermal stabilization of an electronic component constructed according to an embodiment of the invention is illustrated in FIG. 2. Apparatus 100 includes dual-chambered enclosure 205 having upper metal housing 210 and lower metal housing 215 arranged so as to surround an internal area of multi-layer PCB substrate 220. Electronic component 225 to be thermally stabilized is mounted on multi-layer PCB substrate 220. Thermal conduction to the electronic component 225 is achieved by use of thermal conducting tape or foam 230 between the body of the electronic component 225 and the multi-layer PCB substrate 220.

It is appreciated that dual-chambered enclosure 205 may be a multi-chambered enclosure having more than two chambers. For example, a multi-chambered housing may include housings within housings separated by insulative material.

In accordance with the invention, a matrix including a plurality of thermoelectric devices 235a-d is arranged in a two-dimensional grid on a surface of the multi-layer PCB substrate 220 opposite the electronic component 225. A matrix including a plurality of thermosensitive devices 240a-b is also arranged in a two-dimensional grid around the perimeter of the electronic component 225 for detecting the temperature across electronic component 225. The matrix also includes thermosensitive device 240c mounted on the top surface of electronic component 225. A controller (not shown in FIG. 2) controls the current values applied to the plurality of thermoelectric devices 235a-d based on thermal gradients detected by the plurality of thermosensitive devices 240a-c.

Dual-chambered enclosure 205 also includes a conductive shield 245 surrounding the internal area of the multi-layer PCB substrate 220 in electrical contact with the upper and lower housings 210-215. In addition, an EMI/RFI shield 250 fully encloses the area around the electronic component 225. Upper and lower chambers 255a-b are formed by cavities cast into the upper and lower metal housings 210-215. For each housing, a tight EMI seal is formed into the surface of the PCB 220 and around the perimeter of the enclosed space by a metal-filled elastomer or polymer gasket material 260 that is contact to conductive shield 245 on both surfaces of PCB 220.

The upper and lower housings 210-215 are kept in mechanical compression to ensure good conductivity and shielding around the entire perimeter of the electronic component 225. Plated through vias 265a-g are used to link the conductive shield 245 to conductive shield traces on the inner layers of PCB 220. The number and spacings of the vias and inner layer conductive shields are chosen to minimize EMI and RFI energy escaping or entering the upper and lower housings 210-215.

An insulative material fills the upper and lower chambers 255a-b of upper and lower housings 210-215. The insulative material may be, for example, a high-density insulating Styrofoam. A plurality of openings 270a-b may also be disposed about in the PCB substrate 220 to interrupt any conductive transfer of heat that may take place during operation of the electronic component 225.

Figure 3:
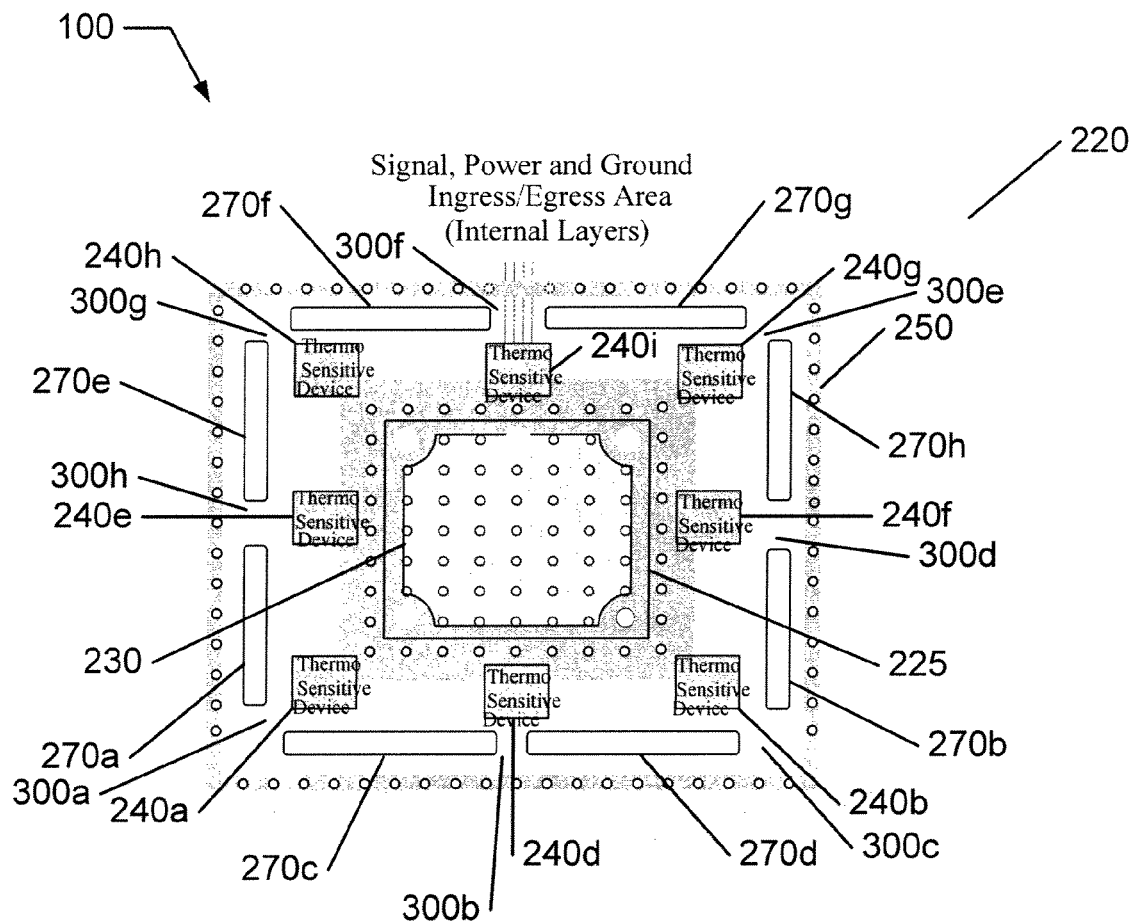
FIG. 3 illustrates a top view of an apparatus for thermal stabilization of an electronic component constructed according to an embodiment of the invention.

It is appreciated that electrical power, ground and other signals are provided to the enclosed area within the upper and lower housings 210-215 through regions intermediate the plurality of openings 270a-b. Power, ground and signal traces from the PCB 220 to the upper and lower chambers 255a-b may enter the chambers 255a-b through any number of isthmuses in PCB 220. In one exemplary embodiment, the power, ground and signal traces may enter the chambers 255a-b through a single isthmus (such as shown in FIG. 3) to localize heat dissipation through the traces to one particular region. Further, the power, ground and signal traces may be kept to a minimum to reduce the number of metal traces which are a major contributor to heat transfer between the upper and lower chambers 255a-b to the PCB 220.

In one exemplary embodiment, all of the internally controllable electronic components share a serial bus. In one embodiment, in addition to the power and ground traces, there may be additional signal traces that traverse the chambers' boundaries, such as, for example, a clock signal, a serial data signal, and a serial clock for the serial bus. The serial data signal may be used for the current values generated by the controller, such as controller 130 of FIG. 1.

It is appreciated that capacitive or inductive coupling may be used on the signal paths to further reduce the number of traces. For example, the signal paths may be encoded with an 8 B/10 B encoding to remove the DC component when using capacitive coupling. In addition, optical transmission may be used to limit the signal traces and thus reduce parasitic heat loss.

A top view of apparatus 100 is illustrated in FIG. 3. Apparatus 100 is shown with a plurality of thermosensitive devices 240a-h arranged in a two-dimensional grid around the perimeter of electronic component 225 and on the same surface of PCB 220 as electronic component 225. Thermosensitive devices 240a-h are placed as close as possible to electronic component 225 to monitor the temperature of a region surrounding the component 225.

It is appreciated that a multiplicity of thermosensitive devices may be used to measure thermal gradients around the component 225. As shown in FIG. 3, there are eight thermosensitive devices 240a-i. It is also appreciated that one or more of thermosensitive devices 240a-i may be in close thermal contact with electronic component 225. The one or more thermosensitive devices 240a-i may also be in direct contact with electronic component 225. For example, one or more thermosensitive devices may be mounted on the surface of electronic component 225, such as thermosensitive device 240c (shown in FIG. 2) mounted on top of electronic component 225.

FIG. 3 also shows a set of void channels or perforations 270a-h in the PCB 220 arranged around the perimeter of electronic component 225 and internal to the EMI/RFI shield 250. Much of the heat leakage that occurs from within the EMI/RFI shield 250 to the external environment takes place through isthmuses 300a-h of PCB 220 intermediate the voids 270a-h. The placement of voids 270a-h reduces the heat conduction through the isthmuses 300a-h. Strategic placement of thermoelectric devices adjacent to the isthmuses 300a-h serves to combat the temperature gradients surrounding and across electronic component 225.

Figure 4:
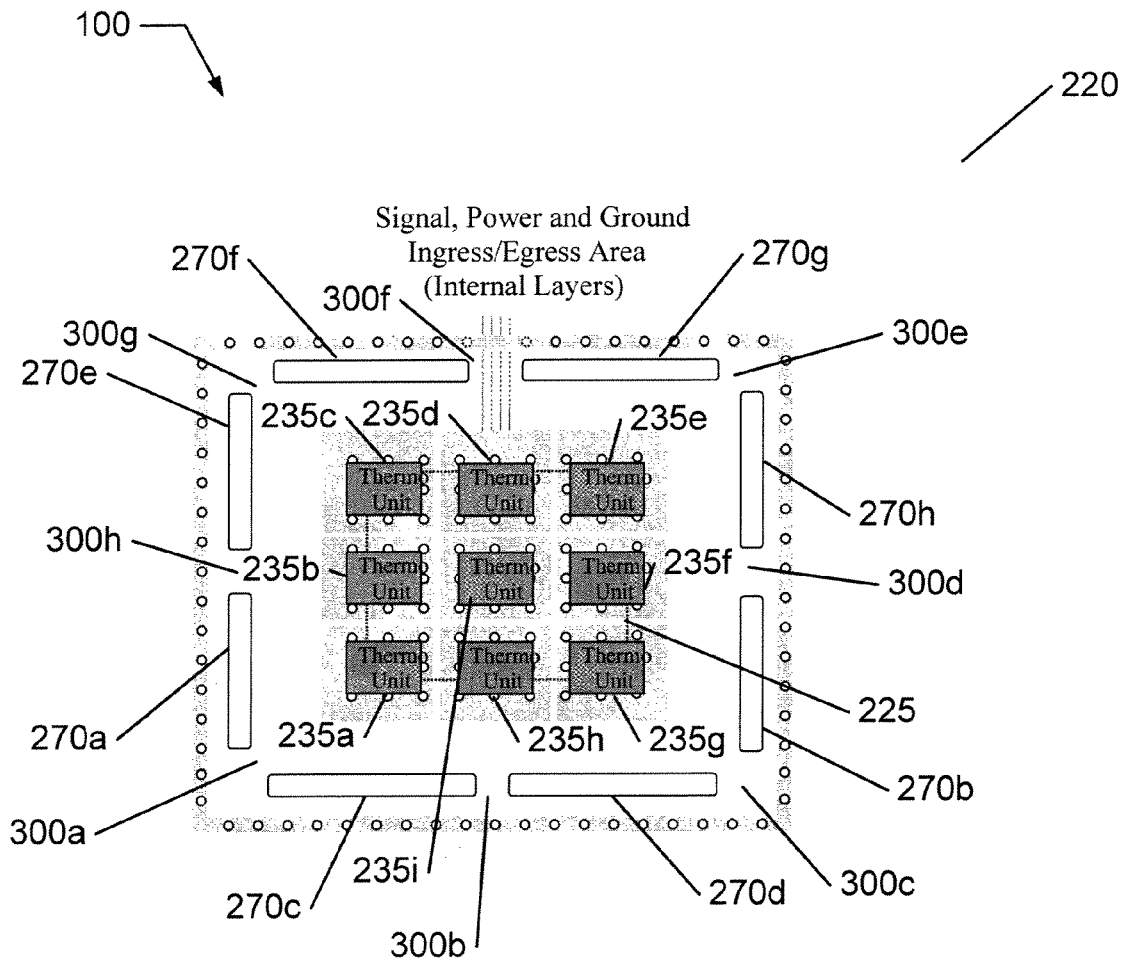
FIG. 4 illustrates a bottom view of an apparatus for thermal stabilization of an electronic component constructed according to an embodiment of the invention.

A set of thermoelectric devices adjacent to isthmuses 300a-h is illustrated in FIG. 4. Thermoelectric devices 235a-i are also arranged in a two-dimensional grid but on a surface of PCB substrate 220 that surrounds and is opposite to the thermally stabilized region on the other side of PCB 220. The placement pattern for the thermoelectric devices 235a-i is intended for thermal dispersion in a given pattern, either uniform or not. There are nine thermoelectric devices 235a-i as shown, with each one serving an area on the side opposite the electronic component 225.

Metal-plate through vias may be dispersed on a metal surface to conduct heat from the surface mounting the thermoelectric devices 235a-i to the surface mounting the electronic component 225. Each thermoelectric device surface area may be separated from other thermoelectric devices to provide better separation of control in a given area. In one exemplary embodiment, the thermally stabilized side surface area may be a single metal surface to disperse heat in a thermal dispersion pattern to the electronic component 225, either uniformly or not.

Figure 5:
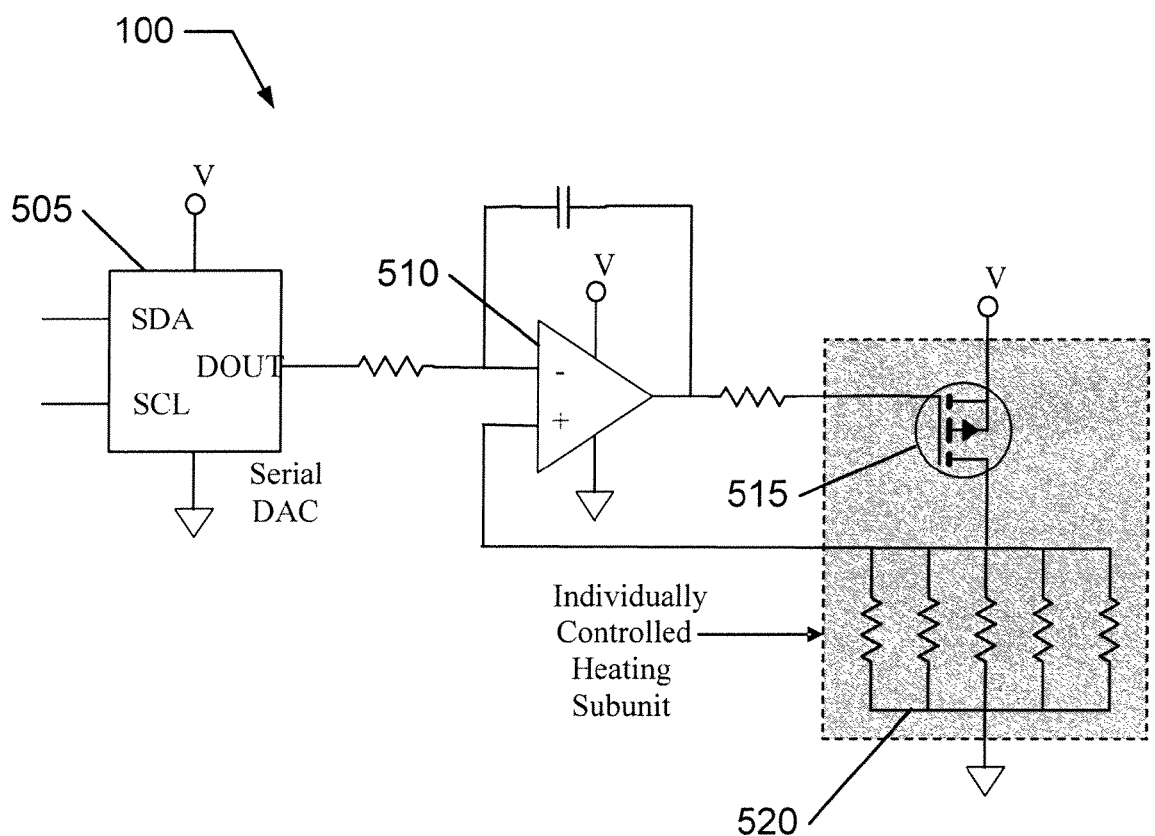
FIG. 5 illustrates a circuit diagram for one exemplary embodiment of the thermoelectric devices shown in FIG. 4.

A circuit diagram for a thermoelectric device constructed in accordance with one embodiment of the invention is illustrated in FIG. 5. Thermoelectric device 500 is a heating device for heating an electronic component as described above. Serial Digital Analog Converter ("Serial DAC") 505 receives serial data representing a set of current values from a controller, such as controller 130, at its "SDA" input. A serial clock signal is input into its "SCL" input and a supply voltage is input into the "V" input. Serial DAC 505 converts the serial data sent from the controller into a voltage output at "DOUT".

The voltage output is passed to operational amplifier 510, which works as a low-pass filter to set the voltages across the heating device. In one embodiment, the heating device is implemented with a power FET 515 in combination with a multiplicity of surface mounted resistors 520. The multiplicity of resistors 520 may be mounted on the PCB substrate in a dispersed pattern to provide a given distribution of heat to the electronic component in the area of the heating device.

In one exemplary embodiment, the resistors 520 may be uniformly distributed around power FET 515 to provide a uniform distribution of heat. The uniform distribution of heat enables a constant uniform temperature over the surface of the PCB substrate directly under the electronic component. In the case where the electronic component is an oscillator, for example, the constant uniform temperature greatly improves the frequency stability of the oscillator in the thermally-stabilized housing.

In another exemplary embodiment, the resistors 520 may be spatially distributed around power FET 515 to provide a non-uniform distribution of heat. The non-uniform distribution of heat may be used, for example, to characterize the electronic component. In the case where the electronic component is an oscillator, the non-uniform distribution of heat may be used to determine the oscillator's frequency response over a wide range of temperatures. This may allow for any unknown oscillator to be used as the controller together with the thermoelectric devices and temperature sensors may set up thermal gradients around the oscillator to understand its response over a wide range of temperatures. The unknown oscillator may be, for example, an off-the-shelf, inexpensive component that has not yet been characterized.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

What is claimed is:

1. An apparatus comprising:
   a matrix of thermoelectric devices to set thermal gradients across an electronic component within a housing;
   a matrix of thermosensitive devices to measure thermal gradients associated with the electronic component; and
   a controller for controlling the matrix of thermoelectric devices based on the thermal gradients measured by the matrix of thermosensitive devices, the controller configured to identify an average thermal gradient associated with an external ambient temperature measured over a given time period, to stabilize temperature within the housing by establishing a temperature set-point above the average thermal gradient, and to maintain the temperature within the housing at the temperature set-point so that the temperature within the housing remains above the average thermal gradient.

2. The apparatus of claim 1, wherein the electronic component is selected from a surface mounted and a through-hole mounted component mounted on a first surface of a printed circuit board substrate.

3. The apparatus of claim 2, wherein the housing is mounted on the printed circuit board substrate, and wherein the housing is an enclosed housing.

4. The apparatus of claim 2, wherein the matrix of thermoelectric devices includes a plurality of thermoelectric devices arranged in a two-dimensional grid in a second surface of the substrate opposite the first surface.

5. The apparatus of claim 4, wherein the matrix of thermosensitive devices includes a plurality of thermosensitive devices mounted in a two-dimensional grid on the first surface of the substrate surrounding the electronic component.

6. The apparatus of claim 5, wherein the plurality of thermosensitive devices are mounted on a surface of the electronic component.

7. The apparatus of claim 4, wherein the plurality of thermoelectric devices comprises a plurality of heating devices having a plurality of resistive elements.

8. The apparatus of claim 4, wherein the plurality of thermoelectric devices comprises a plurality of Peltier devices.

9. The apparatus of claim 4, further comprising a thermal conducting compound between the electronic component and the second surface of the substrate.

10. The apparatus of claim 1, further comprising an electronic magnetic interference and radio frequency interference shield enclosing the electronic component.

11. The apparatus of claim 8, wherein the plurality of thermoelectric devices are arranged to distribute heat to the electronic component in a thermal dispersion pattern.

12. The apparatus of claim 5, wherein the matrix of thermosensitive devices further comprises a thermosensitive device to measure ambient temperature within the enclosed housing.

13. The apparatus of claim 1, wherein the electronic component comprises a crystal oscillator.

14. The apparatus of claim 1, wherein the controller comprises a multiple-input, multiple-output controller.

15. The apparatus of claim 1, wherein the controller controls the matrix of thermoelectric devices based on a matrix of thermocouple coefficients comprising a plurality of thermocouple coefficients corresponding to a set of thermal gradients detected by the matrix of thermosensitive devices and a set of voltage values generated by the matrix of thermoelectric devices.

16. A method of controlling thermoelectric devices, comprising:

detecting thermal gradients measured by a matrix of thermosensitive devices associated with an electronic component within a housing;

controlling a set of current values applied to a matrix of thermoelectric devices based on the detected thermal gradients;

identifying an average thermal gradient associated with an external ambient temperature measured over a given time period; and stabilizing temperature within the housing by establishing a temperature set-point above the average thermal gradient, and by maintaining the temperature within the housing at the temperature set-point above the average thermal gradient so that the temperature within the housing remains above the average thermal gradient.

17. The method of claim 16, wherein controlling the set of current values applied to the matrix of thermoelectric devices includes controlling a set of current values applied to a plurality of thermoelectric devices arranged in a two-dimensional grid in a second surface of the substrate opposite the first surface.

18. The method of claim 16, wherein detecting thermal gradients includes measuring thermal gradients with a plurality of thermosensitive devices mounted in a two-dimensional grid on the first surface of the substrate surrounding the electronic component.

19. The method of claim 18, wherein detecting thermal gradients includes measuring an ambient temperature outside the housing with an ambient thermosensitive device.

20. The method of claim 19, wherein controlling the set of current values applied to the matrix of thermoelectric devices includes generating a matrix of thermocouple coefficients comprising a plurality of thermocouple coefficients corresponding to a set of thermal gradients detected by the matrix of thermosensitive devices and a set of voltage values generated by the matrix of thermoelectric devices.

21. The method of claim 20, wherein generating the matrix of thermocouple coefficients comprises generating parasitic thermal impedance coefficients for the ambient temperature measured by the ambient thermosensitive device.

22. The method of claim 21, further comprising initializing the matrix of thermocouple coefficients.

23. The method of claim 20, wherein generating the matrix of thermocouple coefficients includes adjusting the thermocouple coefficients based on the temperature set-point.

24. The method of claim 16, wherein identifying the average thermal gradient includes measuring the average thermal gradient over at least 24 hours.

* * * * *